US010334363B2

(12) United States Patent
Ito

(10) Patent No.: US 10,334,363 B2

(45) Date of Patent: Jun. 25, 2019

(54) AUDIO SIGNAL PROCESSING CIRCUIT AND ELECTRONIC APPARATUS INCLUDING THE SAME

(71) Applicant: ROHM CO., LTD., Ukyo-Ku, Kyoto (JP)

(72) Inventor: Kinji Ito, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 127 days.

(21) Appl. No.: 15/478,744

(22) Filed: Apr. 4, 2017

(65) Prior Publication Data

US 2017/0295428 A1 Oct. 12, 2017

(30) Foreign Application Priority Data

Apr. 6, 2016 (JP) ................................ 2016-076345

(51) Int. Cl.
*H03G 5/00* (2006.01)
*H04R 3/04* (2006.01)

(52) U.S. Cl.
CPC ..................................... *H04R 3/04* (2013.01)

(58) Field of Classification Search
CPC ........................................................ H03G 5/00
See application file for complete search history.

(56) References Cited

U.S. PATENT DOCUMENTS 5,886,552 A * 3/1999 Chai ..................... H04L 7/0338 327/144
7,230,461 B1 * 6/2007 Savoj ...................... H03L 7/183 327/156
2003/0090401 A1 * 5/2003 Yoshizawa .............. H03M 3/32 341/152
2006/0151783 A1 * 7/2006 Otani .................... H01L 21/761 257/48
2007/0133442 A1 * 6/2007 Masuda ................... H04B 3/20 370/286
2008/0080650 A1 * 4/2008 Adachi ................ H04L 7/0029 375/355
2008/0192875 A1 * 8/2008 Saito ...................... H04H 20/48 375/362
2008/0198985 A1 * 8/2008 Krampl ............... H04M 1/7385 379/93.06
2009/0271133 A1 * 10/2009 Ho ......................... G01R 29/26 702/69

(Continued)

FOREIGN PATENT DOCUMENTS

JP 2012023616 A 2/2012
JP 2015198370 A 11/2015

*Primary Examiner* — Olisa Anwah
(74) *Attorney, Agent, or Firm* — Cantor Colburn LLP

(57) ABSTRACT

An audio signal processing circuit is disclosed. The audio signal processing circuit includes a digital signal processing part formed in a digital area, and configured to process a digital audio signal; an analog circuit formed in an analog area, and configured to process an analog audio signal; a frequency divider formed in the digital area, and configured to divide a system clock signal to generate a first clock signal to be provided to the digital signal processing part and a second clock signal to be provided to the analog area; and a retiming circuit formed in the analog area, and configured to retime the second clock signal by using the system clock signal and provide the retimed second clock signal to the analog circuit.

16 Claims, 12 Drawing Sheets

200

(56) References Cited

U.S. PATENT DOCUMENTS

| | | | | |
|---|---|---|---|---|
| 2010/0045388 | A1* | 2/2010 | Xu | H03J 1/0008 331/18 |
| 2012/0319749 | A1* | 12/2012 | Thaller | H03L 7/183 327/158 |
| 2015/0222282 | A1* | 8/2015 | McAdams | H03K 5/00006 327/145 |
| 2016/0119111 | A1* | 4/2016 | Fernald | H04L 7/0338 375/371 |

* cited by examiner

200a

AUDIO SIGNAL PROCESSING CIRCUIT AND ELECTRONIC APPARATUS INCLUDING THE SAME

CROSS-REFERENCE TO RELATED APPLICATION(S)

This application is based upon and claims the benefit of priority from Japanese Patent Application No. 2016-076345, filed on Apr. 6, 2016, the entire contents of which is incorporated herein by reference.

TECHNICAL FIELD

The present disclosure relates to an audio signal processing circuit and an electronic apparatus including the same.

BACKGROUND

FIG. 1 depicts a block diagram of an audio signal processing circuit 100*r*. The audio signal processing circuit 100*r* is an analog/digital mixed circuit including a digital unit 110 that handles a digital signal and an analog circuit 120 that handles an analog signal, both of which are integrated. The digital circuit 110 includes a signal processing part 112 that receives data such as digital audio data and performs predetermined signal processing on the received data. Output data of the signal processing part 112 is provided to the analog circuit 120. The analog circuit 120 converts the data $D_{OUT}$ from the signal processing part 112 into an analog signal $A_{OUT}$ and outputs the analog signal $A_{OUT}$ to the outside.

The digital circuit 110 further includes a frequency divider 114 that receives a clock signal (e.g., system clock signal) and divides the received clock signal to generate two clock signals CLKD and CLKA. The signal processing part 112 processes an audio signal in synchronization with the clock signal CLKD. The analog circuit 120 processes the audio data $D_{OUT}$ from the signal processing part 112 in synchronization with the clock signal CLKA.

In the audio signal processing circuit 100*r* as described above, jitters of the clock signals may cause a significant problem. FIG. 2A shows a simplified configuration of the frequency divider 114 and FIG. 2B shows a jitter of the clock signal CLKA. In the digital circuit 110, since several thousands to tens of thousands of gate elements constituting the digital circuit 110 are operated in synchronization with the clock signal CLKD, a noise N synchronized with the clock signal CLKD is superimposed on a power supply voltage VDD. Since the frequency divider 114 is operated with the power supply voltage VDD on which the noise N is superimposed, the operation speed (signal slew rate) of elements constituting the frequency divider 114 varies from moment to moment. As a result, the clock signal CLKA generated by the frequency divider 114 has a jitter corresponding to the variation in the power supply voltage VDD.

If the jitter of the clock signal CLKA is too great, the output of the analog circuit 120, mainly a D/A (digital-to-analog) converter, deviates from an expected value that would be obtained by D/A-converting the data $D_{OUT}$ from the signal processing part 112 at the same interval for each sampling rate. As a result, deterioration of sound quality may be caused.

FIG. 3 is a circuit diagram showing another audio signal processing circuit 100*s*. In this audio signal processing circuit 100*s*, a frequency divider 124 is formed in an analog area 122 that includes an analog circuit 120. In a system in which a power plane 116 for a digital circuit 110 and a power plane 126 for the analog circuit 120 are isolated from each other, a noise generated in the power plane 116 on the digital side is less likely to propagate to the power plane 126 on the analog side. Therefore, a jitter of the clock signal CLKA generated by the frequency divider 124 is decreased as compared with that of FIG. 1.

In the configuration of FIG. 3, the timing for the delivery of the clock signal CLKD from the analog circuit 120 to the digital circuit 110 is critical, which makes the delay adjustment and the like very complicated. In particular, in the audio signal processing circuit, the sampling rate of the audio data varies and the frequencies of the clock signals CLKA and CLKD need to be changed according to the sampling rate. Therefore, the frequency divider 124 is constituted by a variable frequency divider.

Even if the delay adjustment is optimized for a specific sampling rate, timing deviation occurs for another sampling rate. This makes the adoption of the configuration of FIG. 3 more difficult.

SUMMARY

The present disclosure provides some embodiments of an audio signal processing circuit capable of a stable operation.

According to an aspect of the present disclosure, there is provided an audio signal processing circuit including a digital signal processing part formed in a digital area, and configured to process a digital audio signal; an analog circuit formed in an analog area, and configured to process an analog audio signal; a frequency divider formed in the digital area, and configured to divide a system clock signal to generate a first clock signal to be provided to the digital signal processing part and a second clock signal to be provided to the analog area; and a retiming circuit formed in the analog area, and configured to retime the second clock signal by using the system clock signal and provide the retimed second clock signal to the analog circuit.

Since the frequency divider is formed in the digital area, the first clock signal can be easily provided to the digital signal processing part at an appropriate timing. Although the second clock signal has a jitter, the effect of the jitter is eliminated by retiming the second clock signal by using the jitter-free original system clock signal in the analog area. Since the retiming circuit is formed in the analog area, a jitter caused by the retiming circuit is also suppressed. Thus, the audio signal processing circuit can perform a stable operation.

The frequency divider may be a variable frequency divider and have a frequency division ratio that is set based on a sampling rate of the digital audio signal. A stable operation can be maintained although the frequency division ratio of the frequency divider changes.

A power plane for the digital area and a power plane for the analog area may be isolated from each other.

The digital signal processing part may process an external digital audio signal as the digital audio signal and output the processed external digital audio signal to the analog circuit. The analog circuit may convert the digital audio signal from the digital signal processing part into an analog audio signal and process the analog audio signal.

The audio signal processing circuit may further include an audio interface circuit configured to receive the external digital audio signal.

The analog circuit may convert an external analog audio signal into a digital audio signal and output the digital audio signal to the digital signal processing part. The digital signal processing part may process the digital audio signal from the analog circuit.

The audio signal processing circuit may be integrated on a single semiconductor substrate. As used herein, the term "integrated" is intended to include both of a case where all elements of a circuit are formed on a semiconductor substrate and a case where main elements of the circuit are integrated on the semiconductor substrate. In addition, some resistors, capacitors, and the like for adjustment of a circuit constant may be provided outside the semiconductor substrate. By integrating the circuit on one chip, the area of the circuit can be reduced and the characteristics of the circuit elements can be kept uniform.

According to another aspect of the present disclosure, there is provided an electronic apparatus or audio system including the above-described audio signal processing circuit, an amplifier configured to amplify the analog audio signal output from the audio signal processing circuit, and an electroacoustic transducer driven by the amplifier.

Any combinations of the above-described elements or changes of the representations of the present disclosure between methods, apparatuses, and systems are effective as embodiments of the present disclosure.

DETAILED DESCRIPTION

Figure 1:
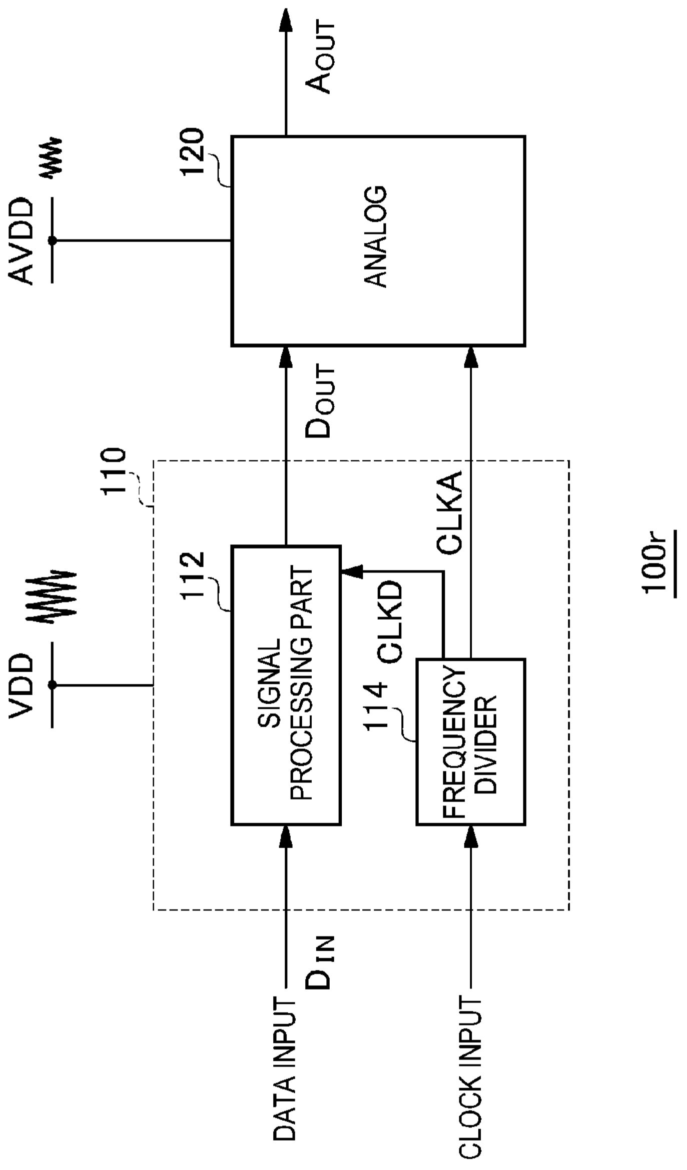
FIG. 1 (RELATED ART)
FIG. 1 depicts a block diagram of an audio signal processing circuit.
Figure 2A:
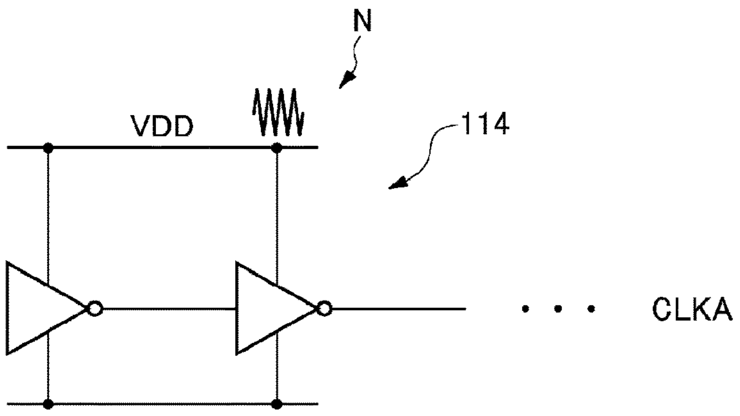
FIG. 2A (RELATED ART)
FIG. 2A illustrates a simplified configuration of a frequency divider.
Figure 2B:
FIG. 2B (RELATED ART)
FIG. 2B illustrates a jitter of a clock signal CLKA.
Figure 3:
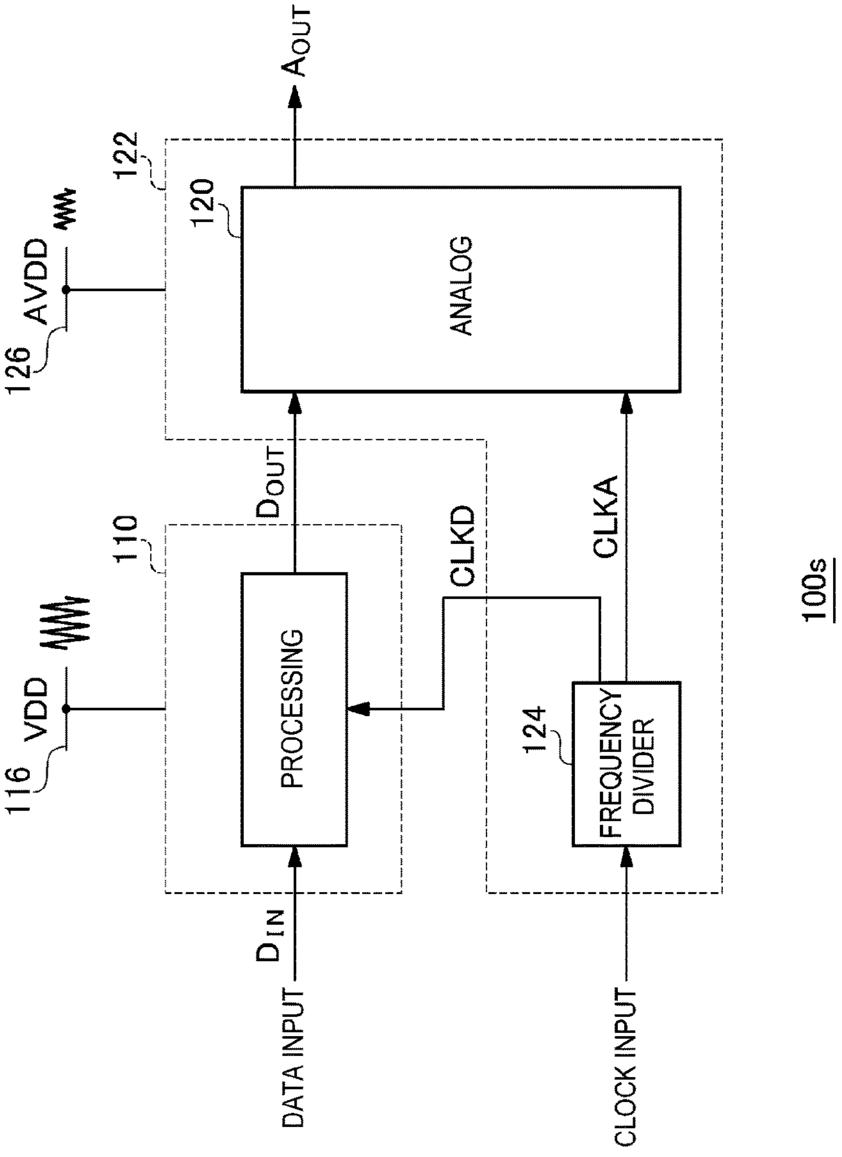
FIG. 3 (RELATED ART)
FIG. 3 depicts a circuit diagram of another audio signal processing circuit.

Preferred embodiments of the present invention will now be described in detail with reference to the drawings. Throughout the drawings, the same or similar elements, members and processes are denoted by the same reference numerals and explanation of which will not be repeated. The disclosed embodiments are provided for the purpose of illustration, not limitation, of the present disclosure and all features and combinations thereof described in the embodiments cannot be necessarily construed to describe the spirit of the present disclosure.

Figure 4:
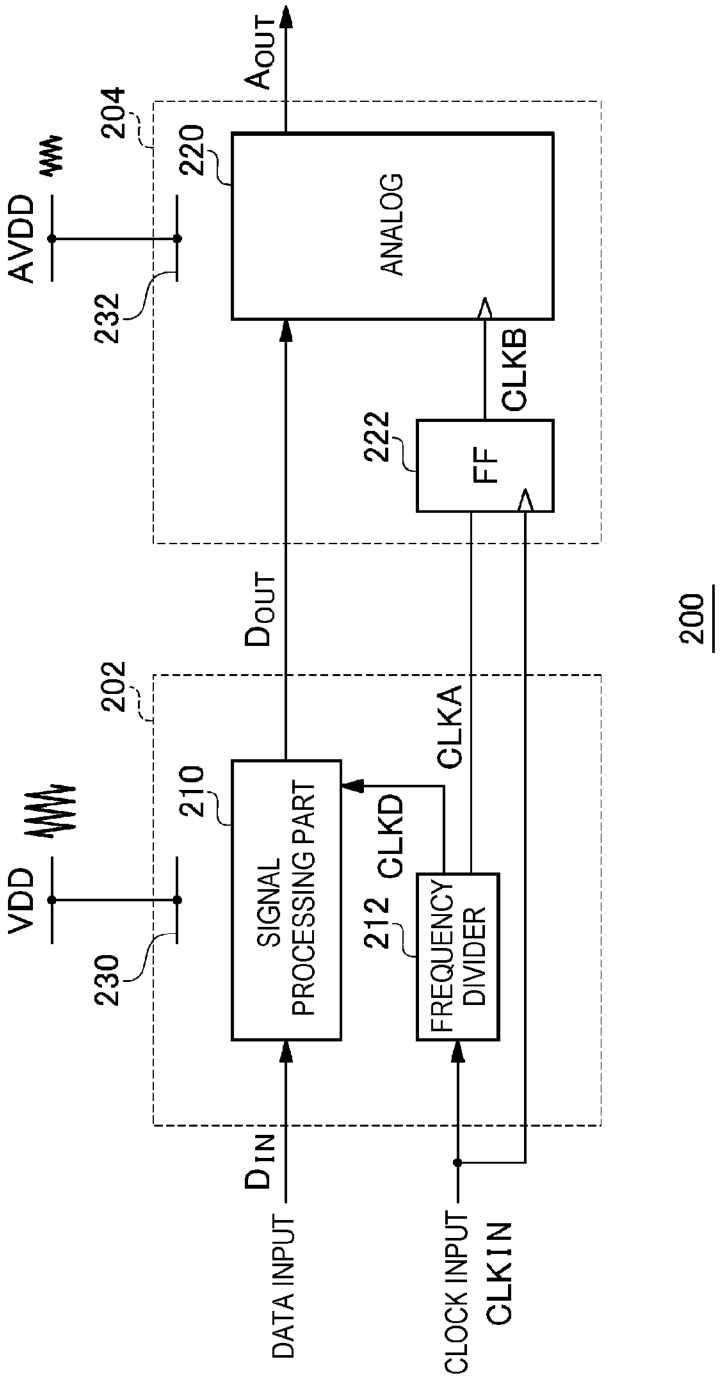
FIG. 4 illustrates a block diagram of an audio signal processing circuit according to an embodiment of the disclosure.

FIG. 4 illustrates a block diagram of an audio signal processing circuit 200 according to an embodiment of the present disclosure. The audio signal processing circuit 200 has a digital area 202 and an analog area 204. A digital circuit is mainly formed in the digital area 202 and an analog circuit is mainly formed in the analog area 204. The audio signal processing circuit 200 is integrated on a single semiconductor substrate.

A digital signal processing part 210 is formed in the digital area 202 and processes a digital audio signal $D_{IN}$. An analog circuit 220 is formed in the analog area 204 and generates an analog audio signal $A_{OUT}$. A frequency divider 212 is formed in the digital area 202 and divides a system clock signal CLKIN to generate a first clock signal CLKD, which is provided to the digital signal processing part 210, and a second clock signal CLKA, which is provided to the analog area 204.

A retiming circuit 222 is formed in the analog area 204 and performs a retiming operation on the second clock signal CLKA by using the system clock signal CLKIN to generate a third clock signal CLKB which is then provided to the analog circuit 220. In this embodiment, the retiming circuit 222 is a flip-flop.

Specifically, the frequency divider 212 may be a variable frequency divider, a frequency division ratio of which is set based on a sampling rate of the digital audio signal $D_{IN}$.

A power plane 230 for the digital area 202 and a power plane 232 for the analog area 204 may be isolated from each other.

For example, the digital signal processing part 210 processes an external digital audio signal $D_{IN}$ to generate a digital audio signal $D_{OUT}$ which is then outputted to the analog circuit 220. The analog circuit 220 includes an A/D (analog-to-digital) converter for converting the digital audio signal $D_{OUT}$ into an analog audio signal at its input stage, and outputs the signal $A_{OUT}$ after processing the analog audio signal.

Figure 5:
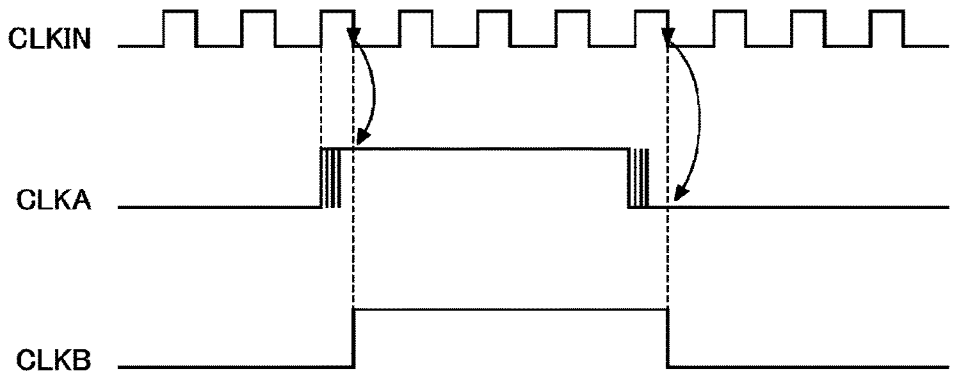
FIG. 5 shows an operation waveform diagram of the audio signal processing circuit of FIG. 4.

The above describes the configuration of the audio signal processing circuit 200. Next, its operation is described below. FIG. 5 shows an operation waveform diagram of the audio signal processing circuit 200 illustrated in FIG. 4, in which the frequency division ratio of the frequency divider 212 is set to 1/4.

A jitter is superimposed on the second clock signal CLKA generated by the frequency divider 212. The retiming circuit 222 uses the system clock signal CLKIN to retime (here, at the timing of a negative edge) the second clock signal CLKA on which the jitter is superimposed, thereby generating the third clock signal CLKB. Since the system clock signal CLKIN is jitter-free, the edge of the third clock signal CLKB generated based on the edge is also jitter-free.

Since the analog circuit 220 converts the digital audio signal $D_{OUT}$ from the digital signal processing part 210 into an analog signal in synchronization with the jitter-free third clock signal CLKB, the circuit can operate in a stable manner. Since the third clock signal CLKB is used as an operation clock for a D/A converter at an initial stage of the analog circuit 220, the D/A converter operates in a low-jitter manner and the deterioration in sound quality can be suppressed in comparison with that in FIG. 1.

Figure 6A:
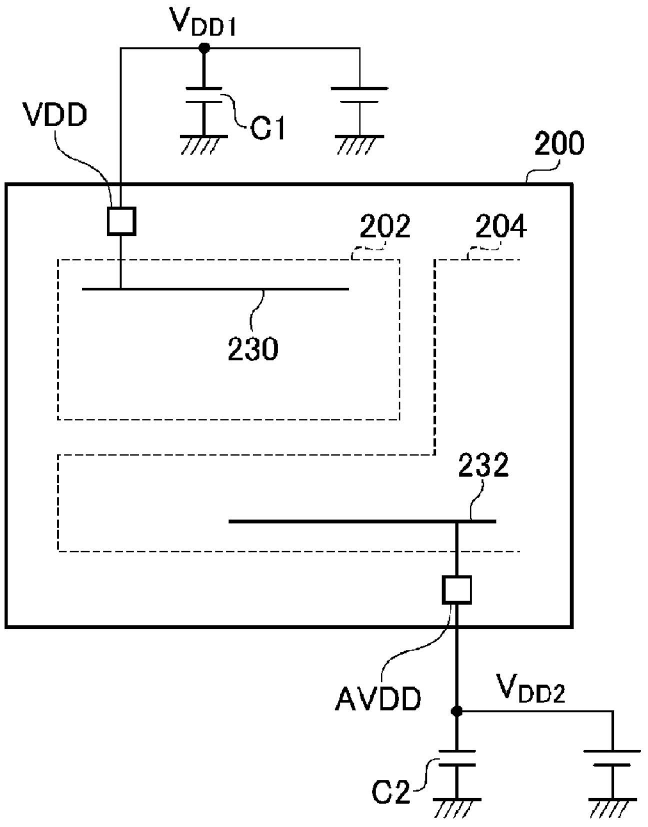
FIG. 6A illustrates a view for explaining power planes in audio signal processing circuit.
Figure 6B:
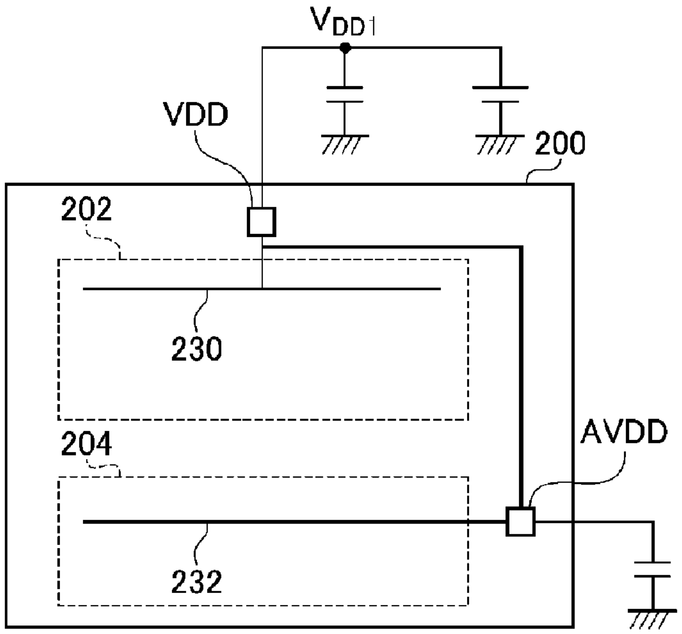
FIG. 6B illustrates another view for explaining power planes in the audio signal processing circuit.

FIGS. 6A and 6B are views for explaining the power planes 230 and 232 in the audio signal processing circuit 200. In FIG. 6A, the power plane 230 for the digital area 202 and the power plane 232 for the analog area 204 are completely isolated from each other. Specifically, a first power supply voltage $V_{DD1}$ is supplied to a VDD terminal, a second power supply voltage $V_{DD2}$ is supplied to an AVDD terminal, and bypass capacitors C1 and C2 are provided to the VDD terminal and the AVDD terminal, respectively, in the outside.

In FIG. 6B, the power plane 230 for the digital area 202 and the power plane 232 for the analog area 204 are electrically connected but may also be described as being isolated from each other. Specifically, the first power supply voltage $V_{DD1}$ is supplied to the VDD terminal and branches therefrom to the power plane 230 for the digital area 202 and the power plane 232 for the analog area 204. The pad (terminal) AVDD is interposed between the two power planes 230 and 232 and the isolation between the two power planes 230 and 232 is ensured by an external bypass capacitor C2 connected to this pad.

Figure 7:
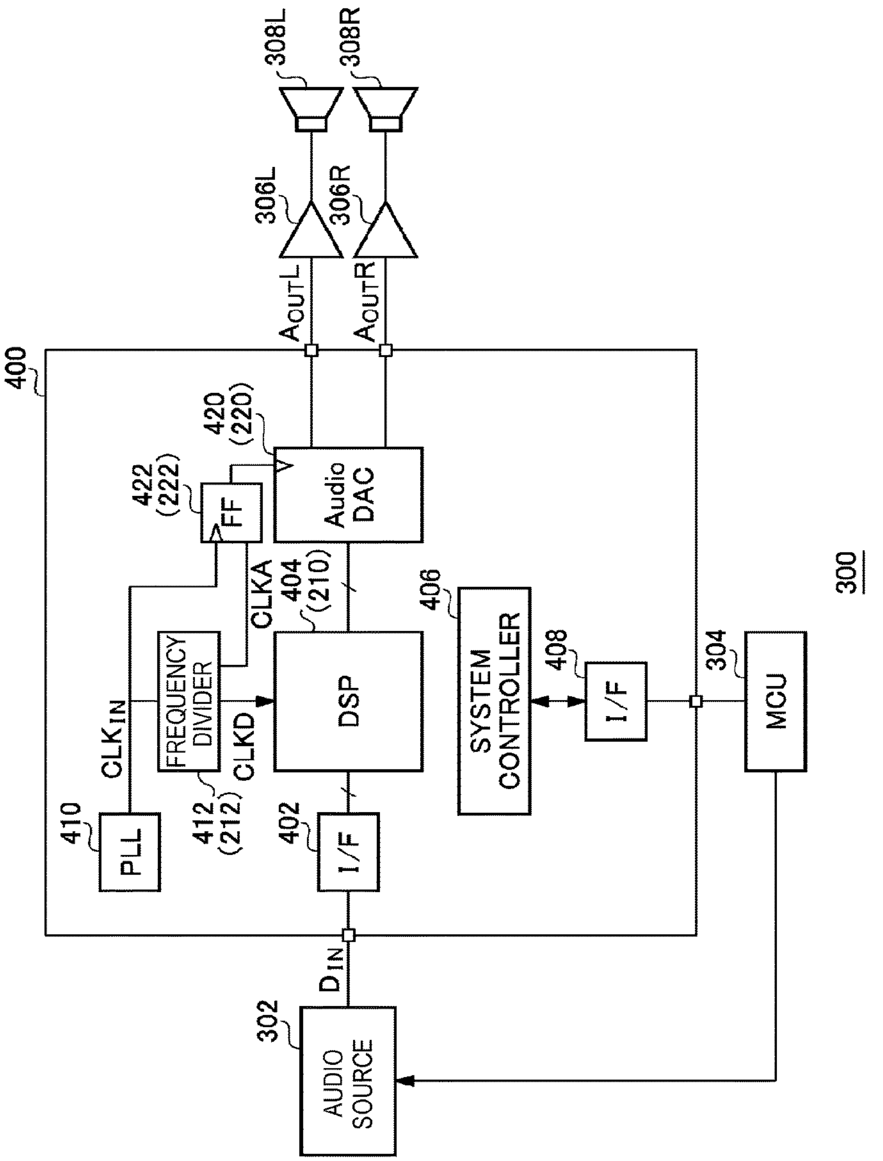
FIG. 7 illustrates a block diagram of an electronic apparatus or an audio system including the audio signal processing circuit according to the embodiment of the present disclosure.

FIG. 7 illustrates a block diagram of an electronic apparatus 300 or an audio system including the audio signal processing circuit 200 according to the embodiment of the present disclosure. The electronic device (audio system) 300 includes an audio source 302, a microcontroller 304, an amplifier 306, an electroacoustic transducer 308, and an audio signal processing IC 400. The electronic apparatus 300 may be a smart phone, a tablet terminal, a portable audio device, a CD player, a DVD player, a digital camera, or the like.

The microcontroller 304 integrally controls the overall operation of the electronic apparatus 300. The audio source 302 starts to reproduce a digital audio signal $D_{IN}$ in response to a reproduction start instruction from the microcontroller 304.

The audio signal processing IC 400 performs various kinds of signal processing on the digital audio signal $D_{IN}$ and converts the digital audio signal $D_{IN}$ into an analog audio signal which is then outputted to amplifiers 306L and 306R in a subsequent stage. The configuration of two stereo channels is here shown, but the number of channels is not particularly limited. The amplifiers 306L and 306R amplify audio signals from the audio signal processing IC 400 and drive electroacoustic transducers 308L and 308R which may be speakers or headphones.

The signal processing by audio signal processing IC 400 may include, but is not limited to, the volume control, the equalizer control, the bus boost control, and the like. The signal processing of the audio signal processing IC 400 can be controlled by the microcontroller 304.

The audio signal processing IC 400 corresponds to the audio signal processing circuit 200 as described above. An audio interface circuit 402 receives the external digital audio signal $D_{IN}$. An interface circuit 408 is connected to the microcontroller 304 and receives a parameter specifying the signal processing. A system controller 406 integrally controls other circuit blocks based on the data received by the interface circuit 408.

A DSP 404 performs signal processing designated by the microcontroller 304 on the digital audio signal $D_{IN}$. The DSP 404 corresponds to the digital signal processing part 210 in FIG. 4. An audio D/A converter 420, which corresponds to the analog circuit 220 in FIG. 4, converts the audio signal $D_{OUT}$ from the DSP 404 into analog signals $A_{OUT}$L and $A_{OUT}$R and outputs the signals $A_{OUT}$L and $A_{OUT}$R. A PLL circuit 410 multiplies a reference clock signal generated by a crystal oscillator to generate a system clock signal CLKIN. A frequency divider 412, which corresponds to the frequency divider 212 in FIG. 4, divides the system clock signal CLKIN to generate the first clock signal CLKD and the second clock signal CLKA. A flip-flop 422, which corresponds to the retiming circuit 222 in FIG. 4, retimes the second clock signal CLKA based on the system clock signal CLKIN.

According to the electronic apparatus (audio system) 300, it is possible to reproduce sound with high sound quality.

FIRST MODIFICATION EXAMPLE

Figure 8:
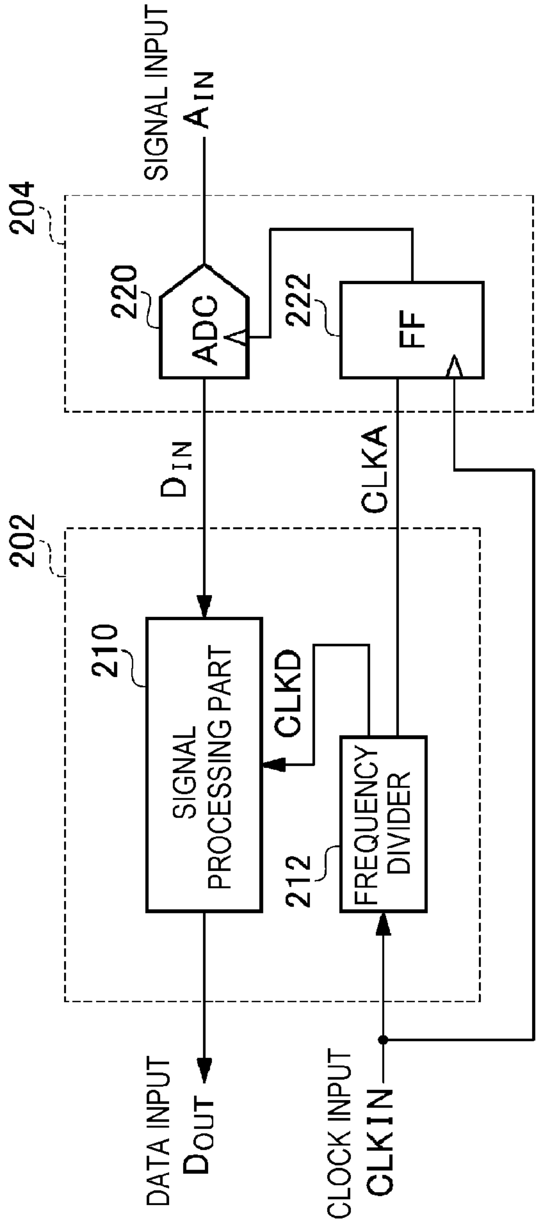
FIG. 8 illustrates a block diagram of an audio signal processing circuit according to a first modification example of the present disclosure.

FIG. 8 illustrates a block diagram of an audio signal processing circuit 200*a* according to a first modification example of the present disclosure. In this modification example, the order of signal processing of a digital circuit and an analog circuit is reversed from that of FIG. 4. The analog circuit 220 includes an A/D converter that converts an analog audio signal $A_{IN}$ into a digital audio signal $D_{IN}$ which is then outputted to a digital signal processing part 210. The digital signal processing part 210 processes the digital audio signal $D_{IN}$ from the analog circuit 220 to generate a digital audio signal $D_{OUT}$. In this modification example, an operation clock signal for the analog circuit 220 can also be generated in a low-jitter manner by disposing the frequency divider 212 in the digital area 202 and disposing the retiming circuit 222 in the analog area 204, thereby preventing the deterioration in sound quality.

SECOND MODIFICATION EXAMPLE

Figure 9:
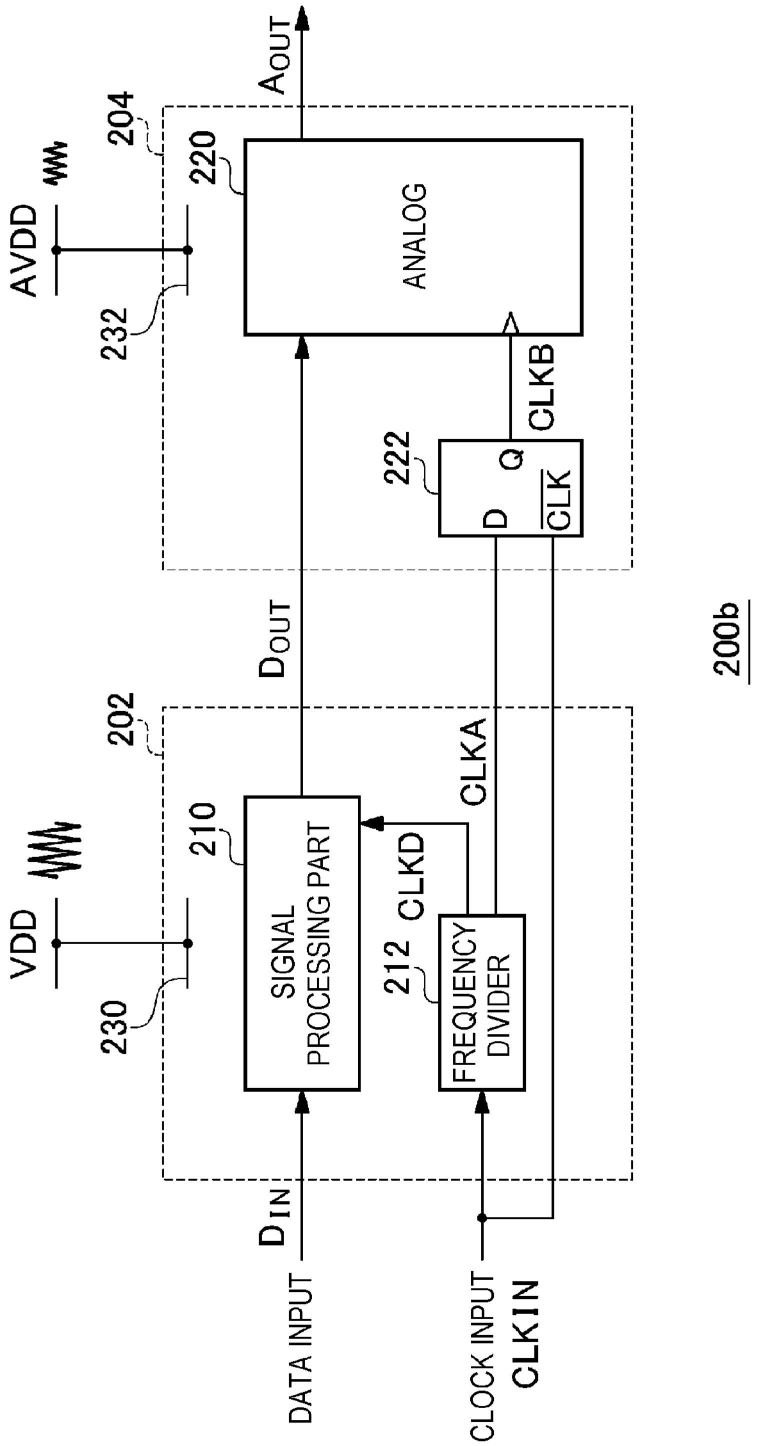
FIG. 9 illustrates a block diagram of an audio signal processing circuit according to a second modification example of the present disclosure.

The retiming circuit 222 is a flip-flop in the above embodiment, but is not limited thereto. FIG. 9 illustrates a block diagram of an audio signal processing circuit 200*b* according to a second modification example of the present disclosure. When a timing margin is sufficient, the retiming circuit 222 may be constituted by a latch. In this example, a low active D latch is used as the retiming circuit 222.

Figure 10:
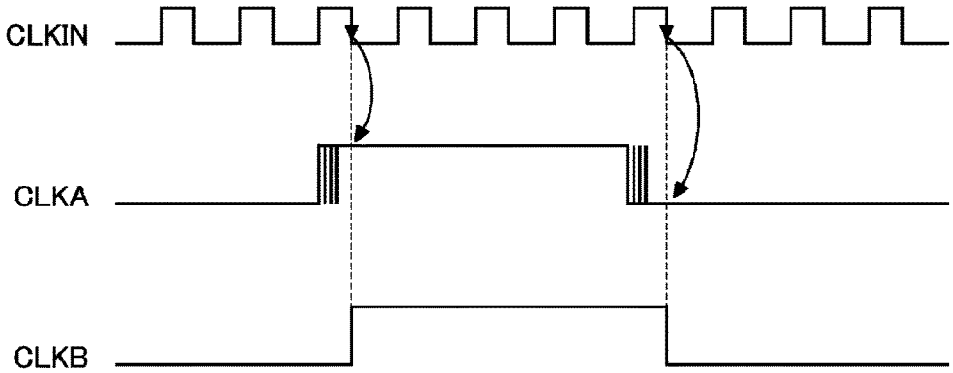
FIG. 10 shows an operation waveform diagram of the audio signal processing circuit of FIG. 9.

FIG. 10 shows an operation waveform diagram of the audio signal processing circuit 200*b* in FIG. 9. The latch serving as the retiming circuit 222 is low-active, passes CLKA in a period during which the system clock signal CLKIN has a low level, and holds an immediately previous value in a period during which the system clock signal CLKIN has a high level. This modification example obtains the same effects as the above embodiment.

THIRD MODIFICATION EXAMPLE

Figure 11:
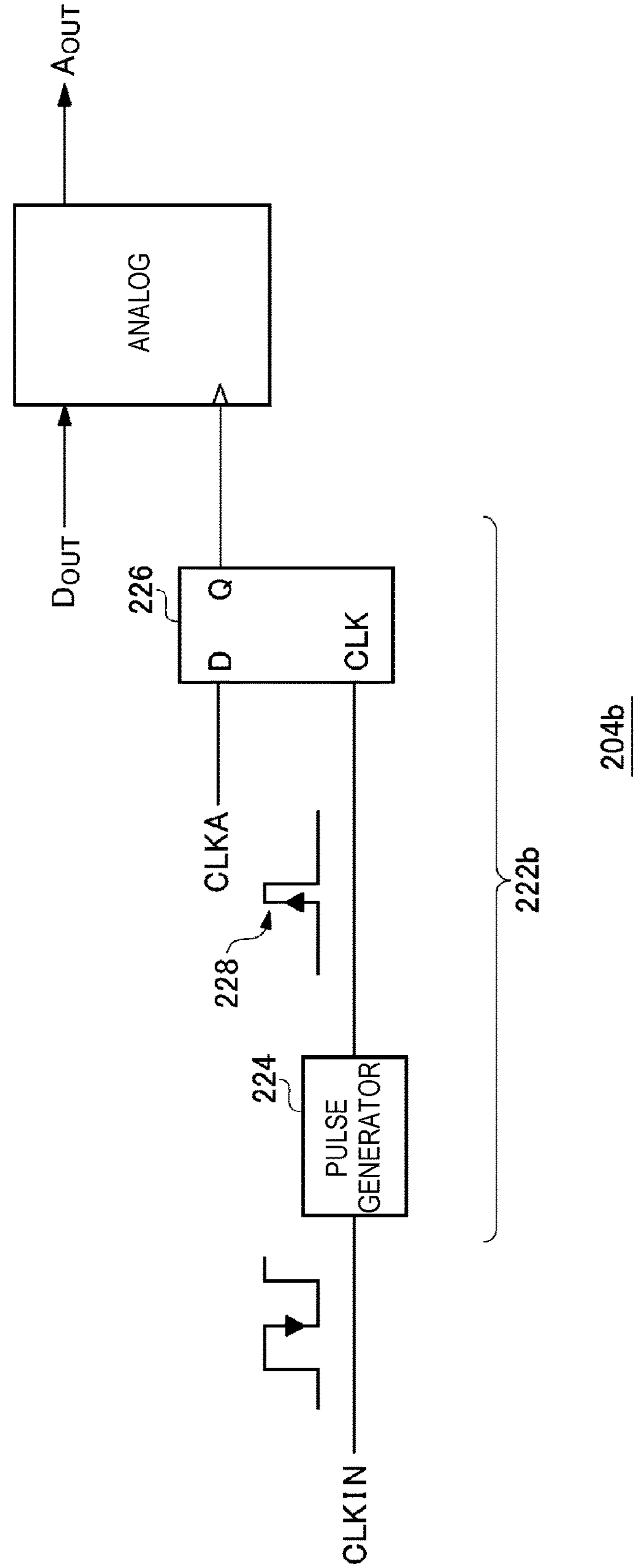
FIG. 11 illustrates a block diagram of an analog area of an audio signal processing circuit according to a third modification example of the present disclosure.

FIG. 11 illustrates a block diagram of an analog area 204*b* of an audio signal processing circuit according to a third modification example of the present disclosure. A retiming circuit 222*b* includes a pulse generator 224, such as a one-shot circuit, and a D latch 226. In response to a negative edge of the system clock signal CLKIN, the pulse generator 224 generates a narrow pulse signal 228 which is then provided to a CLK terminal of the D latch 226. The D latch 226 passes the second clock signal CLKA in an interval in which the narrow pulse signal 228 has a high level, that is, for a short period from the negative edge of the system clock signal CLKIN, and latches an immediately previous level in an interval in which the narrow pulse signal 228 has a low level.

This modification example has the same effects as the above embodiment when a timing margin is small.

FOURTH MODIFICATION EXAMPLE

Although the audio signal processing circuit has been described above, the present disclosure can be applied to various signal processing circuits handling other analog and/or digital signals.

FIFTH MODIFICATION EXAMPLE

Although it is illustrated in the embodiment that the circuit block using a clock signal in the analog area is an A/D converter or a D/A converter, the present disclosure may be applied to various circuit blocks operating with clock synchronization, including a serial/parallel converter, a parallel/serial converter, a differential transmitter, a differential receiver, and so on.

According to some embodiments of the present disclosure, it is possible to provide an audio signal processing circuit capable of a stable operation.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An audio processing circuit comprising:
- a digital signal processing part formed in a digital area, and configured to process a digital audio signal;
- an analog circuit formed in an analog area, and configured to process an analog audio signal;
- a frequency divider formed in the digital area, and configured to divide a system clock signal to generate a first clock signal to be provided to the digital signal processing part and a second clock signal to be provided to the analog area; and
- a retiming circuit formed in the analog area, and configured to retime the second clock signal by using the system clock signal and provide the retimed second clock signal directly to the analog circuit.

2. The audio signal processing circuit of claim 1, wherein the frequency divider is a variable frequency divider and has a frequency division ratio that is set based on a sampling rate of the digital audio signal.

3. The audio signal processing circuit of claim 1, wherein a power plane for the digital area and a power plane for the analog area are isolated from each other.

4. The audio signal processing circuit of claim 1, wherein the digital signal processing part processes an external digital audio signal as the digital audio signal and outputs the processed external digital audio signal to the analog circuit, and
- wherein the analog circuit converts the digital audio signal from the digital signal processing part into the analog audio signal and processes the analog audio signal.

5. The audio signal processing circuit of claim 1, further comprising an audio interface circuit configured to receive an external digital audio signal.

6. The audio signal processing circuit of claim 1, wherein the analog circuit converts an external analog audio signal into a digital audio signal and outputs the digital audio signal to the digital signal processing part, and
- wherein the digital signal processing part processes the digital audio signal from the analog circuit.

7. The audio signal processing circuit of claim 1, wherein the audio signal processing circuit is integrated on a single semiconductor substrate.

8. An electronic apparatus comprising:
- the audio signal processing circuit of claim 1;
- an amplifier configured to amplify the analog audio signal outputted from the audio signal processing circuit; and
- an electroacoustic transducer by the amplifier.

9. The audio signal processing circuit of claim 2, wherein a power plane for the digital area and a power plane for the analog area are isolated from each other.

10. The audio signal processing circuit of claim 2, wherein the digital signal processing part processes an external digital audio signal as the digital audio signal and outputs the processed external digital audio signal to the analog circuit, and
- wherein the analog circuit converts the digital audio signal from the digital signal processing part into the analog audio signal and processes the analog audio signal.

11. The audio signal processing circuit of claim 2, further comprising an audio interface circuit configured to receive an external digital audio signal.

12. The audio signal processing circuit of claim 2, wherein the analog circuit converts an external analog audio signal into a digital audio signal and outputs the digital audio signal to the digital signal processing part, and
- wherein the digital signal processing part processes the digital audio signal from the analog circuit.

13. The audio signal processing circuit of claim 2, wherein the audio signal processing circuit is integrated on a single semiconductor substrate.

14. An electronic apparatus comprising:
- the audio signal processing circuit of claim 2;
- an amplifier configured to amplify the analog audio signal outputted from the audio signal processing circuit; and
- an electroacoustic transducer driven by the amplifier.

15. The audio signal processing circuit of claim 1, wherein the analog circuit converts the digital audio signal from the digital signal processing part into the analog audio signal in synchronization with the retimed second clock signal.

16. The audio signal processing circuit of claim 15, wherein an edge of the retired second clock signal is jitter-free.

* * * * *